(12) United States Patent
Chen et al.

(10) Patent No.: US 10,818,517 B2
(45) Date of Patent: Oct. 27, 2020

(54) SEMICONDUCTOR PACKAGE STRUCTURE AND A METHOD OF MANUFACTURING THE SAME

(71) Applicant: Advanced Semiconductor Engineering, Inc., Kaohsiung (TW)

(72) Inventors: Huang Han Chen, Kaohsiung (TW); Ping-Feng Yang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/285,002

(22) Filed: Feb. 25, 2019

(65) Prior Publication Data

US 2020/0273724 A1  Aug. 27, 2020

(51) Int. Cl.
| | |
|---|---|
| *H01L 21/56* | (2006.01) |
| *H01L 23/31* | (2006.01) |
| *H01L 23/538* | (2006.01) |
| *H01L 23/00* | (2006.01) |
| *H01L 21/48* | (2006.01) |
| *H01L 21/78* | (2006.01) |

(52) U.S. Cl.
CPC ........ *H01L 21/565* (2013.01); *H01L 21/4853* (2013.01); *H01L 21/561* (2013.01); *H01L 21/568* (2013.01); *H01L 21/78* (2013.01); *H01L 23/3128* (2013.01); *H01L 23/5386* (2013.01); *H01L 24/19* (2013.01); *H01L 24/20* (2013.01); *H01L 24/96* (2013.01); *H01L 2224/214* (2013.01); *H01L 2224/95001* (2013.01)

(58) Field of Classification Search
CPC . H01L 21/565; H01L 21/4853; H01L 21/561; H01L 21/568; H01L 21/78; H01L 23/3128; H01L 23/5386; H01L 24/19; H01L 24/20; H01L 24/96; H01L 2224/214; H01L 2224/95001
USPC .......................................................... 257/668
See application file for complete search history.

(56) References Cited

U.S. PATENT DOCUMENTS 7,585,713 B2 * 9/2009 Arai .................... H01L 51/0023
438/160

FOREIGN PATENT DOCUMENTS

TW        I374092 B1   10/2012

* cited by examiner

*Primary Examiner* — Tu-Tu V Ho
(74) *Attorney, Agent, or Firm* — Foley & Lardner LLP

(57) ABSTRACT

A method for manufacturing a semiconductor package structure includes providing a semiconductor chip, encapsulating the semiconductor chip via a package body, the package body having a first surface opposite to a second surface, and coating a first self-assembled monolayer (SAM) over the first surface and the second surface of the package body.

20 Claims, 21 Drawing Sheets

| SAM coating steps | | Reaction time |
|---|---|---|
| SAM formation | Iso-propylalcohol(IPA) rinse | 5s |
| | Iso-octane tank | 2 mins |
| | SAM solution tank | 10 mins |
| | Iso-octane tank | 2 mins |
| | Iso-propylalcohol(IPA) rinse | 5s |

FIG. 8

| Coatings | AlN | $Cr_2N$ | $(CrAl)_2N$ | Si-DLC | Cr-DLC |
|---|---|---|---|---|---|
| Flow rate $Ar/N_2/C_2H_2$ (sccm) | 30/12/0 | 34/16/0 | 30/20/0 | 35/0/0 | 25/5/20 |
| Working pressure (Pa) | 0.40 | 0.41 | 0.47 | 0.98 | 0.43 |
| Target materials | Al ×2 | Cr ×2 | Cr ×3 + Al ×1 | C ×3 + Si ×1 | Cr ×2 |
| Target current (A) | Al 6A | Cr 5A | Cr 4A + (Cr+Al) 1A | C3A + (C+Si) 1.5A | Cr 5A |
| Substrate Bias Frequency (kHz) | 40 | 130 | 150 | 100 | 70 |
| Negative bias of substrate (-V) | 100 | 50 | 100 | 60 | 75 |
| Rotation speed of specimen (rpm) | 5 | 9 | 7 | 9 | 9 |
| Distance, target to specimen (cm) | 7 | 11 | 11 | 9 | 13 |
| Deposition time (min) | 420 | 25 | 60 | 150 | 80 |
| As-deposited roughness (nm) | 54 | 4 | 13 | 3 | 6 |
| Annealing temperature (°C) | 300, 600-800 | 300-800 | 300, 600-800 | 200-600 | 200, 300 |

| Coating system | Critical load $L_c$ (N) | Coefficient | Coating time (min) |
|---|---|---|---|
| Single a-C:H system | 5 | 0.15 | 140 |
| Ti/TiN/TiCN system and a-C:H system (two separate single systems) | 15 | 0.15 | 420 |
| Ti/TiN/TiCN/a-C:H (hybrid coating system) | 65 | 0.15 | 320 |

FIG. 9

SEMICONDUCTOR PACKAGE STRUCTURE AND A METHOD OF MANUFACTURING THE SAME

BACKGROUND

1. Technical Field

The present disclosure relates to a semiconductor package structure having hydrophobic surfaces.

2. Description of the Related Art

Fan out panel-level-packaging (FOPLP) faces contamination problems during the course of packaging due to the polar/hydrophilic nature of molding compound surface, chip surface, and metallic surface at the conductive terminal. The polar/hydrophilic surfaces of a semiconductor package demonstrate a water contact angle (WCA) smaller than about 90 degrees, for example, about 70 degrees. Polar/hydrophilic surfaces are prone to have high surface stiction so as to attract contaminants such as tape materials, metal residue, particles, or foreign material thereon and hence lower the production yield of semiconductor packages especially undergoing FOPLP.

Comparative solution to the aforesaid problem is to improve the environment of a clean room through more efficient pumping mechanism. However, the cost of such solution is high and effect rather limited. A method to reduce surface stiction, or the polar/hydrophilic nature, of a semiconductor package during intermediate manufacturing stages or in final product, is desired at least in the field of FOPLP.

SUMMARY

Some embodiments of the present disclosure provide a method for manufacturing a semiconductor package structure, including providing a semiconductor chip, encapsulating the semiconductor chip via a package body, the package body having a first surface opposite to a second surface, and coating a first self-assembled monolayer (SAM) over the first surface and the second surface of the package body.

Some embodiments of the present disclosure provide a method for manufacturing a semiconductor package structure, including providing a semiconductor chip having a first surface, transforming the first surface from a hydrophilic state to a hydrophobic state by immersing the semiconductor chip into a self-assembled monolayer solution, and dicing the semiconductor chip into a plurality of semiconductor packages.

Some embodiments of the present disclosure provide a semiconductor package structure, including a semiconductor die having an active surface and a package body encapsulating the semiconductor die and covering the active surface. A surface of the package body includes a first hydrophobic layer.

BRIEF DESCRIPTION OF THE DRAWINGS

FIG. 3A' is a cross-sectional view of a semiconductor package structure during an alternative intermediate manufacturing stage to FIG. 3A, according to some embodiments of the present disclosure.

FIG. 3C' is a cross-sectional view of a semiconductor package structure during an intermediate manufacturing stage, according to some comparative embodiments of the present disclosure.

FIG. 3FA is a cross-sectional view of a semiconductor package structure during an intermediate manufacturing stage, according to some comparative embodiments of the present disclosure.

FIG. 3FB is a cross-sectional view of a semiconductor package structure during an intermediate manufacturing stage, according to some embodiments of the present disclosure.

FIG. 3M' is a top view of a semiconductor package structure during an intermediate manufacturing stage, according to some embodiments of the present disclosure.

FIG. 3N' is a cross-sectional view of a semiconductor package structure during an alternative intermediate manufacturing stage to FIG. 3A, according to some embodiments of the present disclosure.

FIG. 8 is a table showing operational stages of the semiconductor package structure, according to some embodiments of the present disclosure.

FIG. 9 is a table showing operational stages of the semiconductor package structure, according to some comparative embodiments of the present disclosure.

DETAILED DESCRIPTION

Figure 1:
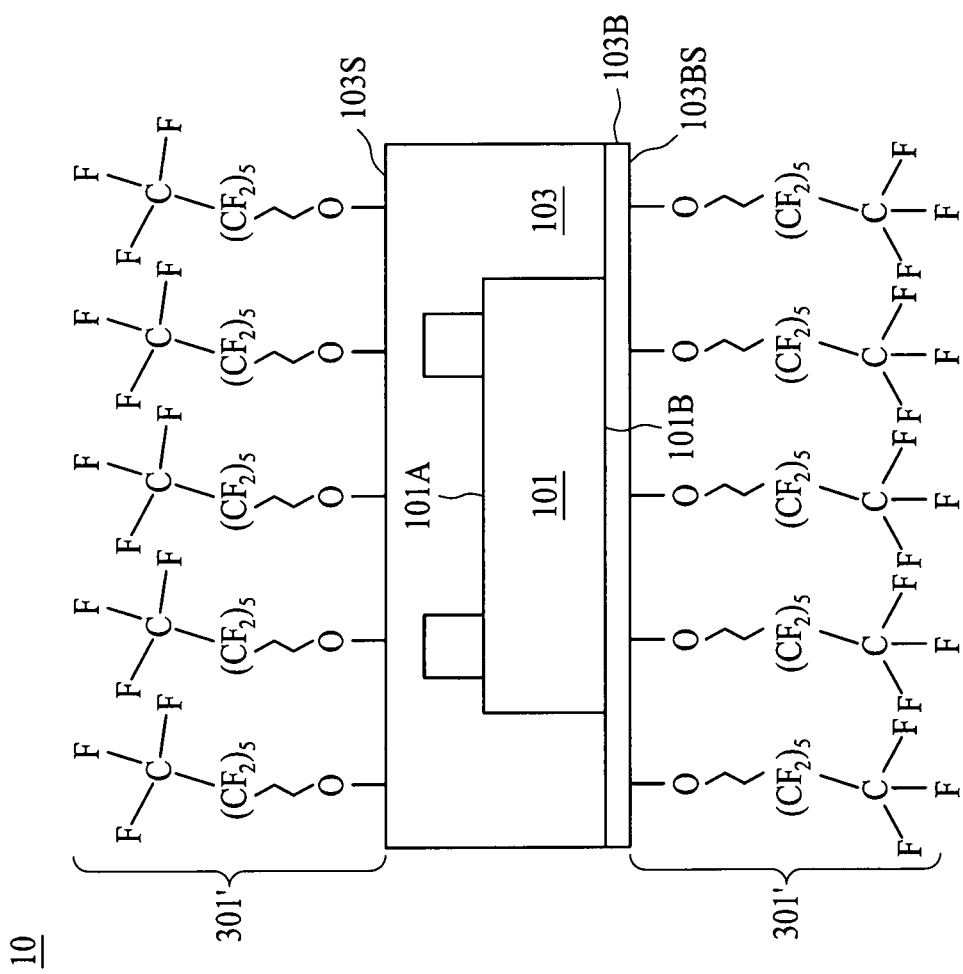
FIG. 1 is a cross-sectional view of a semiconductor package structure, according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 µm, within 30 µm, within 20 µm, within 10 µm, or within 1 µm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

Current disclosure provides a method to alter the polar/hydrophilic nature of the package body surface, chip surface, and metallic surface of the FOPLP by coating a self-assembled monolayer (SAM) of less polar components to increase water repellency and lower the surface stiction effect. In some embodiments, the wafer contact angle (WCA) after the alteration of the package body surface, chip surface, and metallic surface is greater than 90 degrees.

Referring to FIG. 1, FIG. 1 is a cross-sectional view of a semiconductor package structure 10, according to some embodiments of the present disclosure. The semiconductor package structure 10 includes a semiconductor die 101 having an active surface 101A and a back surface 101B opposite to the active surface 101A. The back surface 101B can be an active surface or a passive surface. In some embodiments, the active surface 101A includes conductive pads, conductive pillars, or other equivalents that allow electrical coupling between an active region in the semiconductor die 101 and external conductive circuitry. An encapsulant, for example, a package body 103 covers over the active surface. In some embodiments, the package body may include a molding compound, epoxy, resin, or the like. 101A and side surfaces of the semiconductor die 101. Back surface 101B of the semiconductor die 101 is in contact with a lamination layer 103B, which can be composed of substantially identical or equivalent materials as the package body 103. Alternatively, back surface 101B of the semiconductor die 101 can be encapsulated by the package body 103 (not shown in FIG. 1).

In some embodiments, a surface 103S of the package body 103 has a hydrophobic layer 301' coated thereon. For example, the surface 103S can be closer to the active surface 101A than to the back surface 101B of the semiconductor die 101. In some embodiments, if the lamination layer 103B is replaced by package body 103, the surface having the hydrophobic layer can be closer to the back surface 101B than the active surface 101A of the semiconductor die 101. As shown in FIG. 1, the hydrophobic layer 301' can be coated on the surface 103S of the package body 103 as well as on the surface 103BS of the lamination layer 103B.

The package body 103 and the lamination layer 103B include hydrophilic surfaces, for example, having oxygen dangling bonds at the surfaces. The hydrophobic layer 301' may include an amphiphilic polymer having a hydrophilic end connected to the hydrophilic surfaces of the package body 103 and the lamination layer 103B, and a hydrophobic end opposite to the aforesaid hydrophilic end. In some embodiments, the amphiphilic polymer includes a polymer having a polar water-soluble terminal group attached to a water-insoluble hydrocarbon chain. By covalently bonding the amphiphilic polymer to the surfaces of the package body 103 and the lamination layer 103B, the hydrophilic surfaces thereof are transformed to be hydrophobic, e.g., having a water contact angle greater than 90 degrees. In some embodiments, the hydrophilic end of the hydrophobic layer 301' may include a hydroxyl group. In some embodiments, the hydrophobic end of the hydrophobic layer 301' may include fluorine, for example, a fluorocarbon-based alkyl. In some embodiments, the hydrophobic layer 301' includes long-chain alcohols, for example, 1-octanol or 1-decanol. In some embodiments, the hydrophobic layer 301' includes fluorine-containing long chain alcohols, for example, 1H, 1H, 2H, 2H-perfluoro-1-octanol or 1H, 1H, 2H, 2H-perfluoro-1-decano (combinatorically "FOA"). In some embodiments, the fluorine-containing long chain alcohol is preferred since it demonstrates higher activation energy of hydrolysis for C—F bonds compared to the same for C—H bonds.

Although not illustrated in FIG. 1, side surfaces of semiconductor package structure 10 can be coated with the hydrophobic layer 301' when a coating operation is performed after die-sawing operation. Please refer to FIG. 3V and FIG. 3W of present disclosure for more detailed description. Although not illustrated in FIG. 1, side surfaces of semiconductor die 101 can be coated with a hydrophobic layer, for example, the hydrophobic layer 301' identical to that on the surface 103S of the package body 103. Please refer to FIG. 4A and FIG. 4B of present disclosure for more detailed description.

Figure 2:
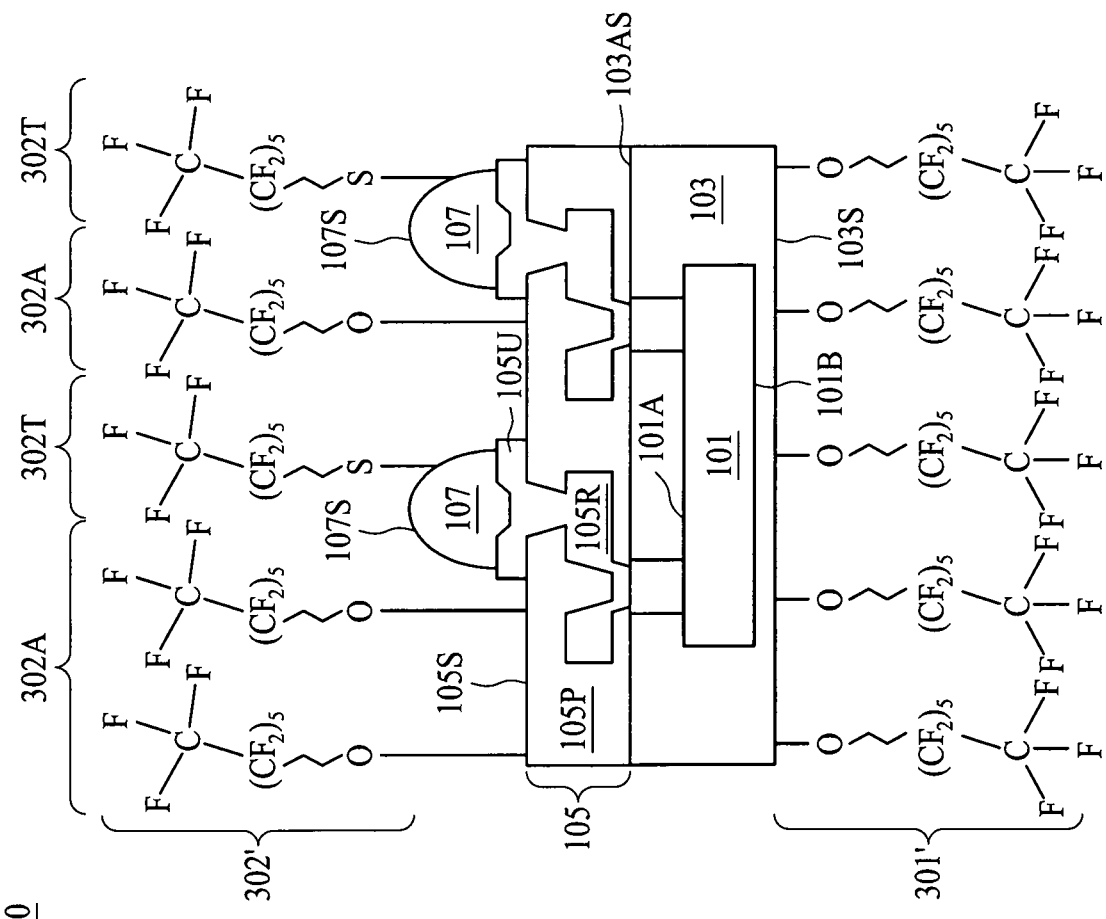
FIG. 2 is a cross-sectional view of a semiconductor package structure, according to some embodiments of the present disclosure.

Referring to FIG. 2, FIG. 2 is a cross-sectional view of a semiconductor package structure 20, according to some embodiments of the present disclosure. Numeric labels in semiconductor package structure 20 which are identical to those in semiconductor package structure 10 of FIG. 1 can be referred thereto and are not repeated here for brevity. The semiconductor package structure 20 further includes a conductive wiring layer 105 disposed over a surface 103AS of the package body 103. In some embodiments, the surface 103AS can be the first surface 1031 of the package body 103 as previously addressed. In some embodiments, the conductive wiring layer 105 includes redistribution layer (RDL) 105R, under bump metallization (UBM) 105U, and passivation layer 105P surrounding the RDL 105R and UBM 105U. In addition, an external connection terminal 107, for example, a solder bump or a solder ball, is positioned over the conductive wiring layer 105, electrically connected to the semiconductor die 101 via the active surface 101A.

A surface 103S of the package body 103 is coated with the hydrophobic layer 301'. A surface 105S of the passivation layer 105P and the surface 107S of the external connection terminal 107 are coated with the hydrophobic layer 302'. A surface 107S of the external connection terminal 107 is coated with the hydrophobic layer 302' different from the hydrophobic layer 302' on the surface 105S of the package body 105. The hydrophobic layer 302' may include different polymers 302A and 302T. Polymer 302A can be obtained at the surface 105S of the passivation layer 105P and polymer 302T can be obtained at the surface 107S of the external connection terminal 107. Polymer 302T may include an amphiphilic polymer having a hydrophilic end connected to the hydrophilic surfaces of the external connection terminal 107, and a hydrophobic end opposite to the aforesaid hydrophilic end. In some embodiments, the amphiphilic polymer includes a polymer having a polar water-soluble terminal group attached to a water-insoluble hydrocarbon chain. By covalently bonding the amphiphilic polymer to the surfaces of the external connection terminal 107, the hydrophilic surfaces thereof are transformed to be hydrophobic, e.g., having a water contact angle greater than 90 degrees. In some embodiments, the hydrophilic end of the polymer 302T may include a thiol group. In some embodiments, the hydrophobic end of the hydrophobic layer 302' may include fluorine, for example, a fluorocarbon-based alkyl. In some embodiments, the polymer 302T includes long-chain thiols, for example, 1-propanethiol, pentanethiol, or 1-dodecanethiol. In some embodiments, the polymer 302T includes fluorine-containing long chain thiols, for example, 1H, 1H, 2H, 2H-perfluorooctyl thiol, or 1H, 1H, 2H, 2H-perfluorodecane thiol (combinatorically "FOT"). In some embodiments, the fluorine-containing long chain thiol is preferred since it demonstrates higher activation energy of hydrolysis for C—F bonds compared to the same for C—H bonds.

Although not illustrated in FIG. 2, side surfaces of semiconductor package structure 20 can be coated with the hydrophobic layer 301' when a coating operation is performed after die-sawing operation. Please refer to FIG. 3V and FIG. 3W of present disclosure. Although not illustrated in FIG. 2, side surfaces of semiconductor die 101 and a semiconductor portion at the active surface 101A of the semiconductor die 101 can be coated with a hydrophobic layer, for example, the hydrophobic layer 301' identical to that on the surface 103S of the package body 103. Although not illustrated in FIG. 2, a metallic or conductive portion at the active surface 101A of the semiconductor die 101 can be coated with a hydrophobic layer, for example, the hydrophobic layer 302' identical to that on the surface 107S of the external connection terminal 107. Please refer to FIG. 4A and FIG. 4B of present disclosure for more detailed description.

Figure 3A:
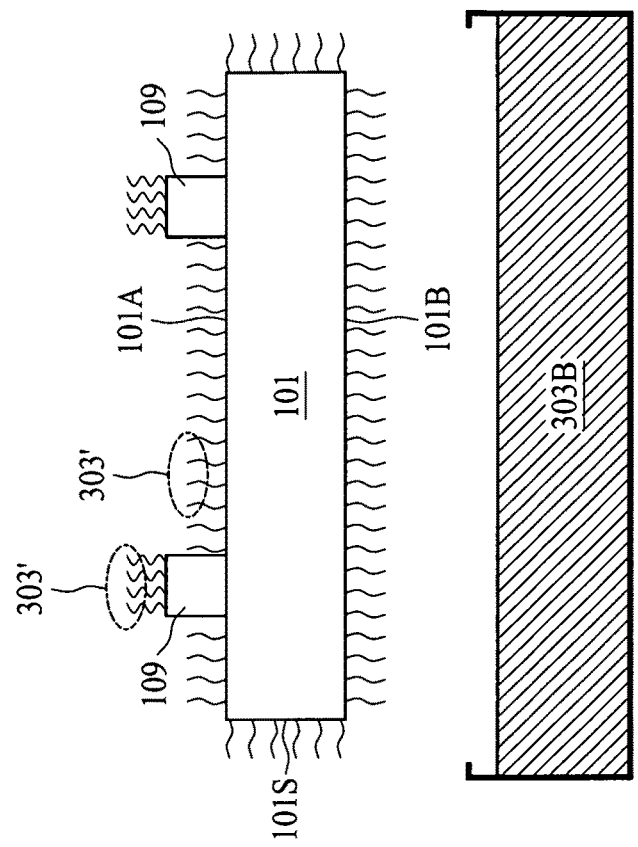
FIG. 3A is a cross-sectional view of a semiconductor package structure during an intermediate manufacturing stage, according to some embodiments of the present disclosure.
Figure 3A:
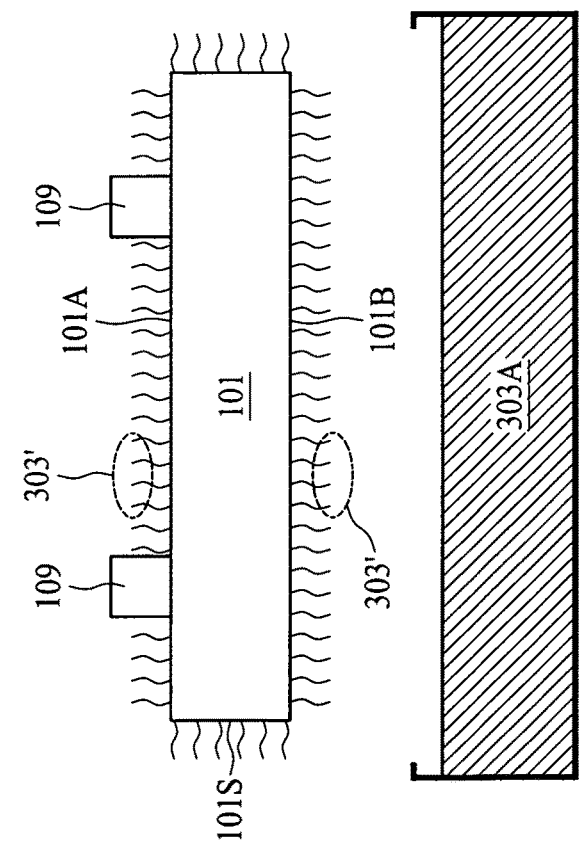
Figure 3B:
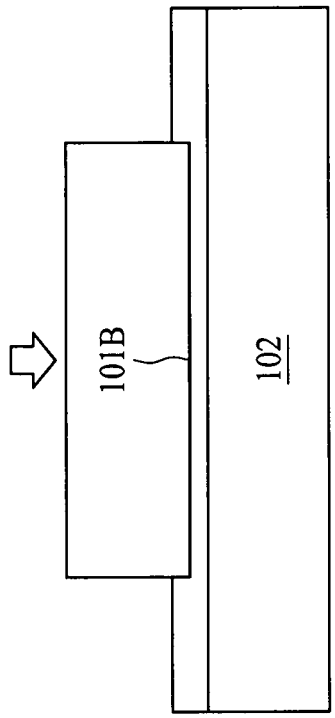
FIG. 3B and FIG. 3C are cross-sectional views of a semiconductor package structure during an intermediate manufacturing stage, according to some embodiments of the present disclosure.
Figure 3C:
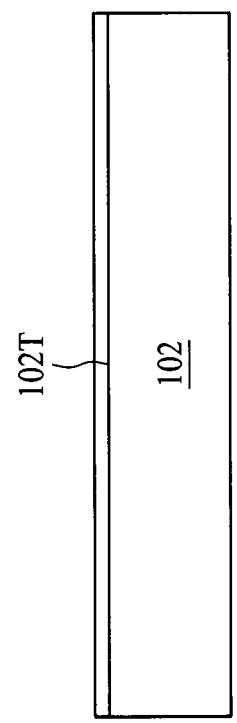
Figure 3C:
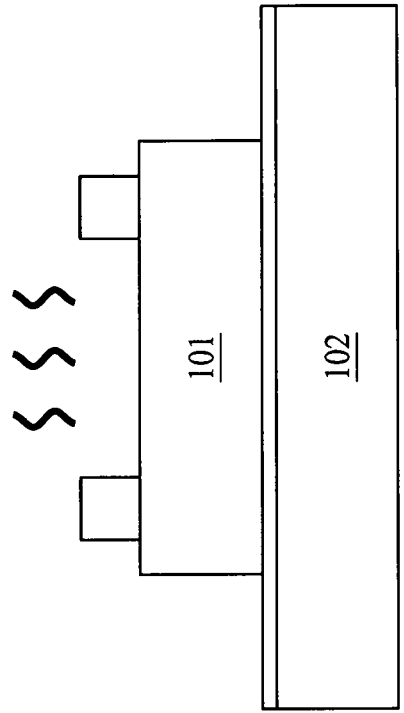
Figure 3D:
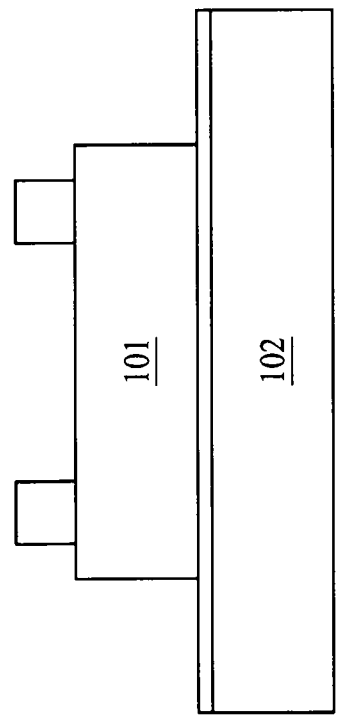
FIG. 3D, FIG. 3E, FIG. 3F, FIG. 3G, FIG. 3H are cross-sectional views of a semiconductor package structure during an intermediate manufacturing stage, according to some embodiments of the present disclosure.
Figure 3E:
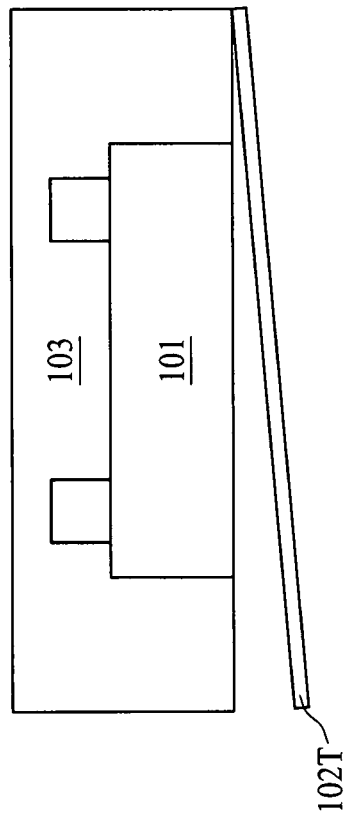
Figure 3G:
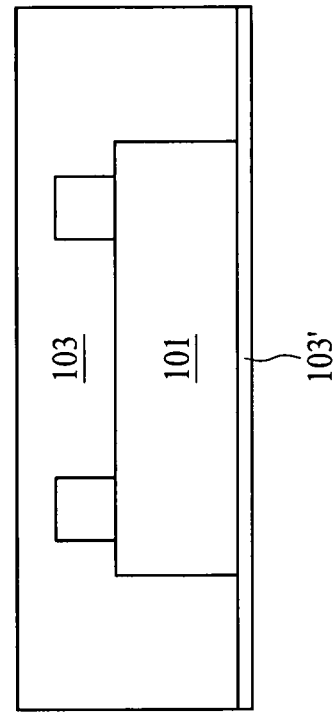
Figure 3F:
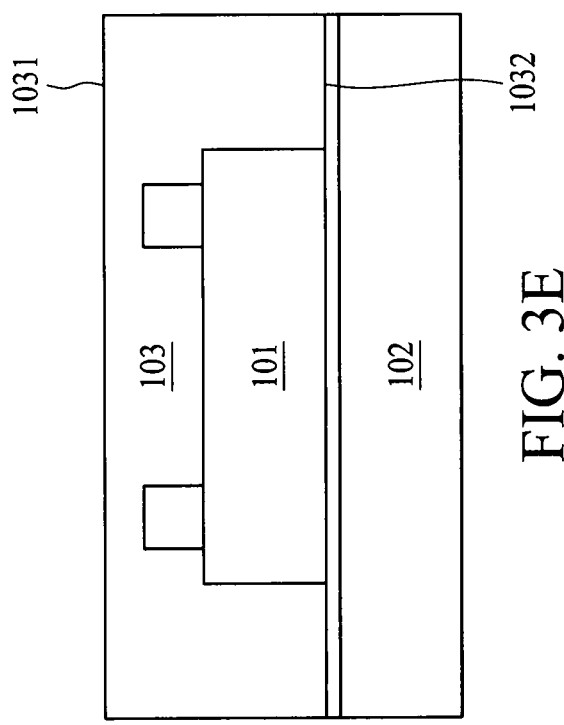
Figure 3H:
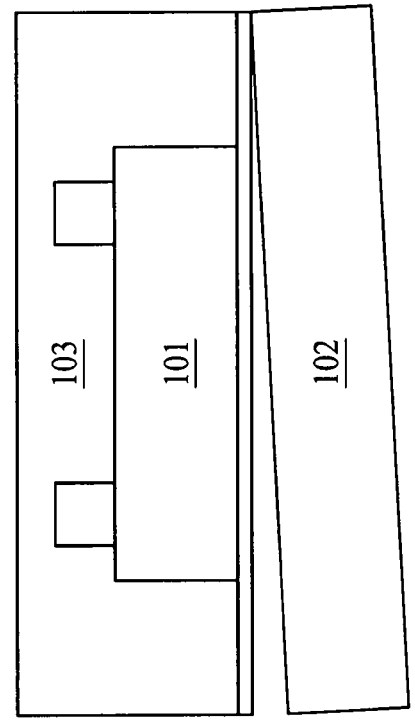
Figure 3F:
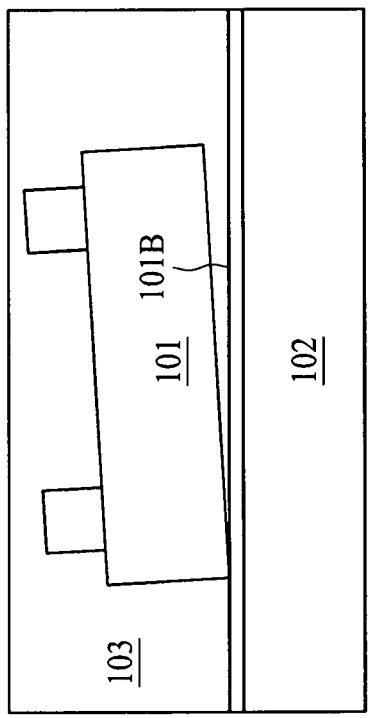
Figure 3F:
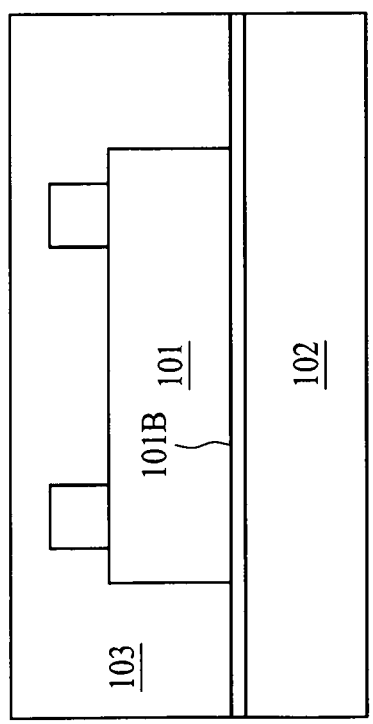
Figure 3K:
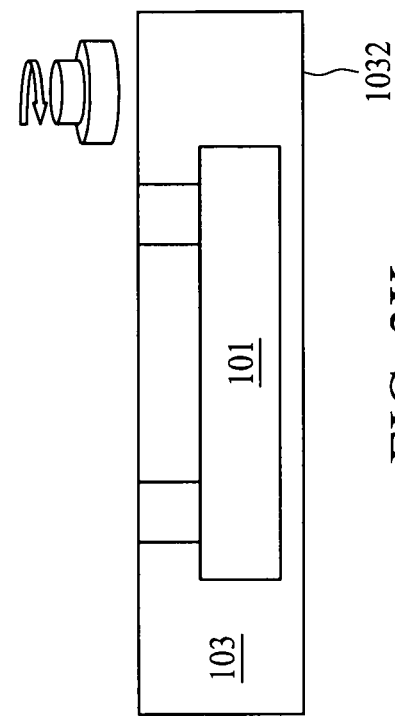
FIG. 3I, FIG. 3J, FIG. 3K, FIG. 3L are cross-sectional views of a semiconductor package structure during an intermediate manufacturing stage, according to some embodiments of the present disclosure.
Figure 3L:
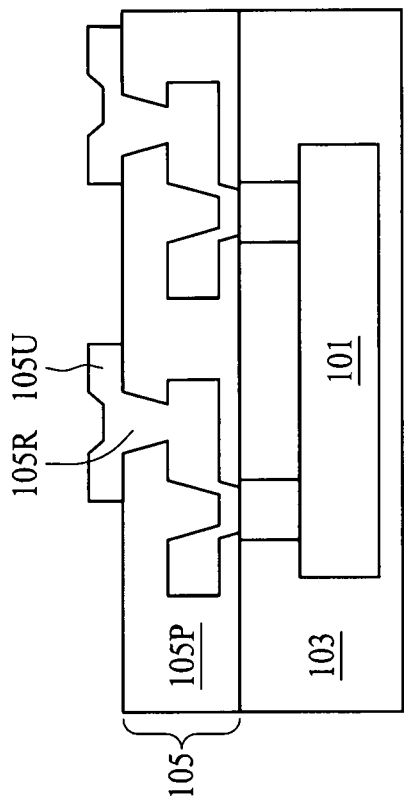
Figure 3I:
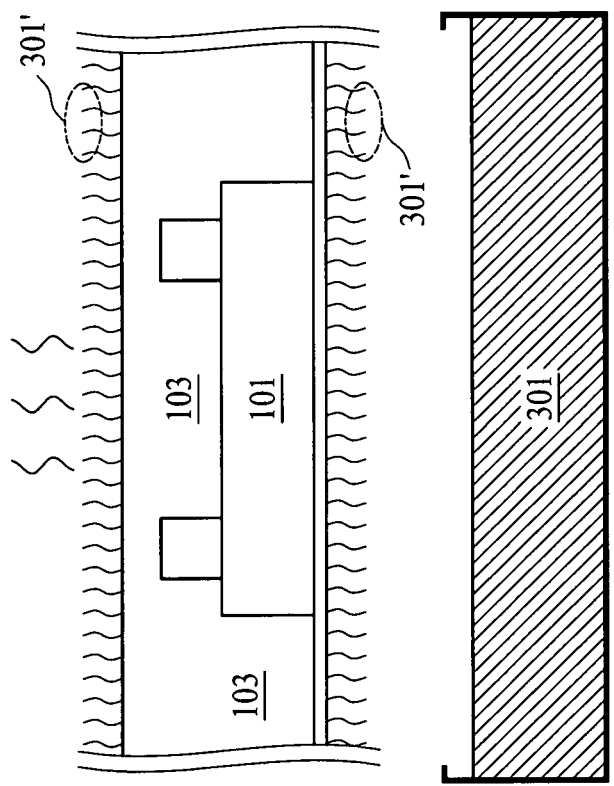
Figure 3J:
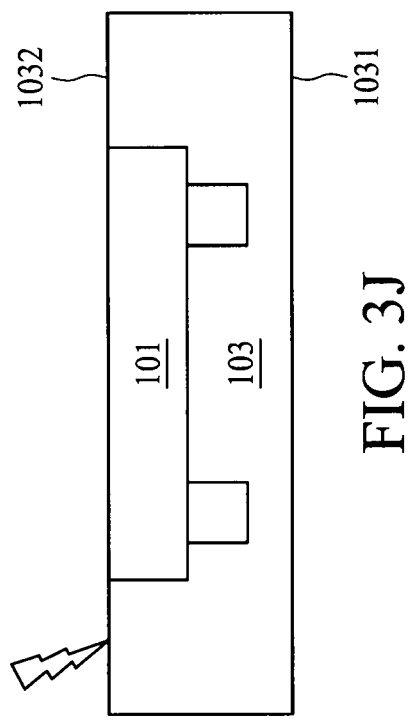
Figure 3M:
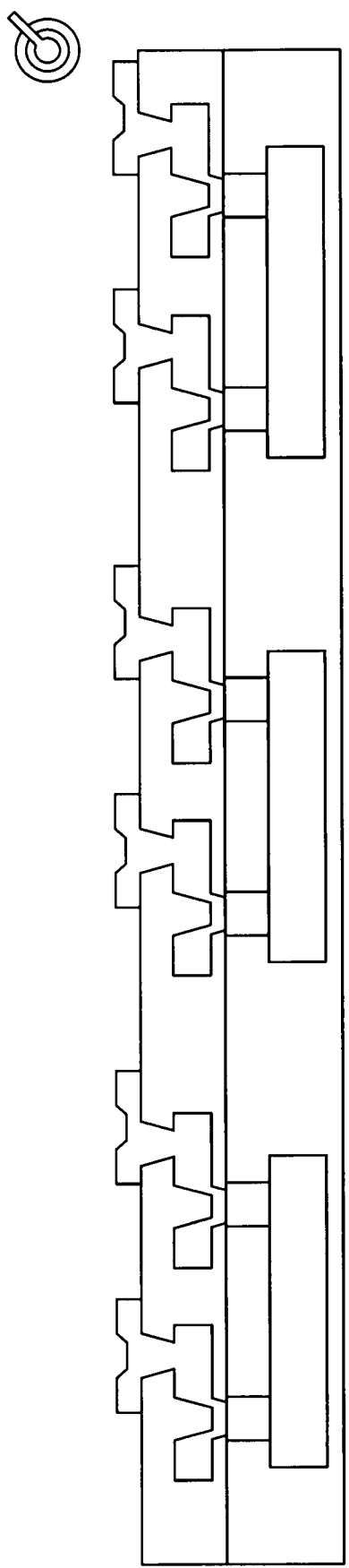
FIG. 3M is a cross-sectional view of a semiconductor package structure during an intermediate manufacturing stage, according to some embodiments of the present disclosure.
Figure 3M:
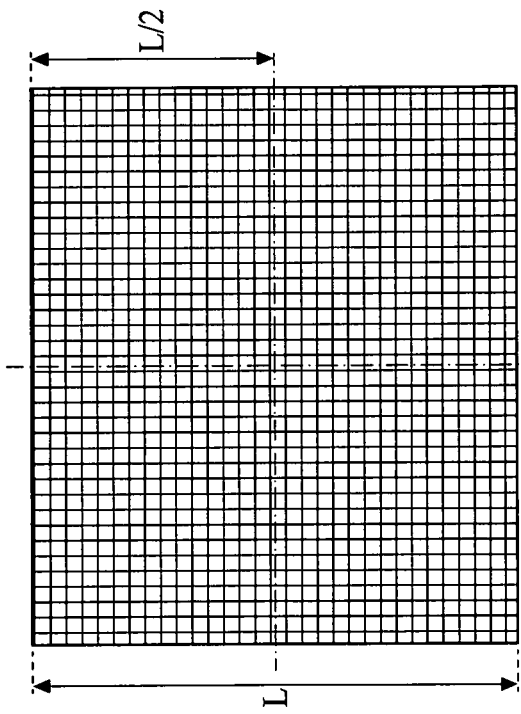
Figure 3N:
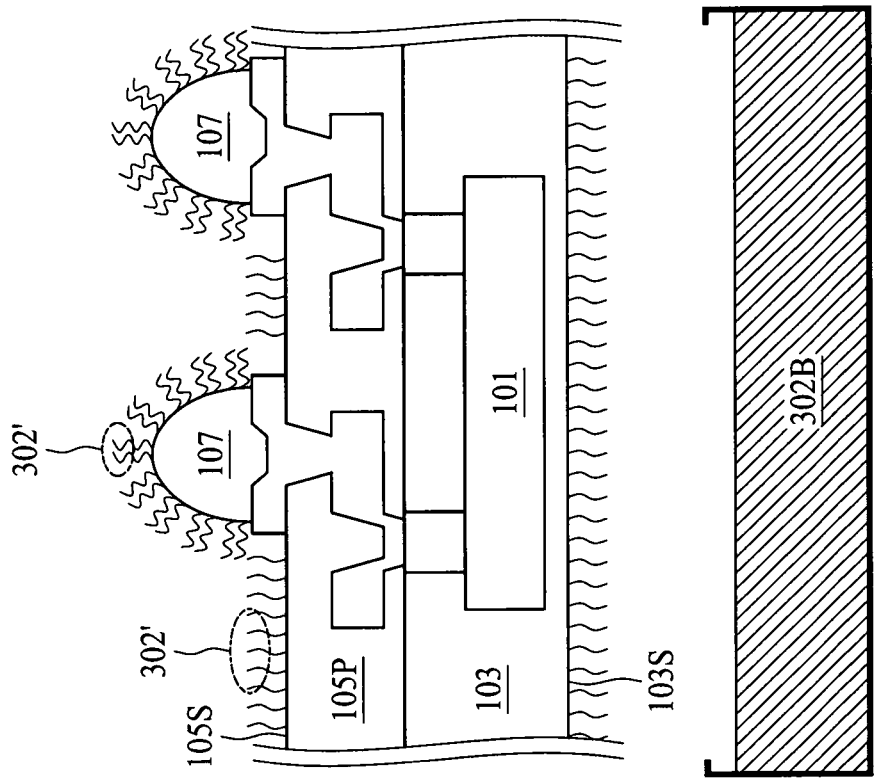
FIG. 3N is a cross-sectional view of a semiconductor package structure during an intermediate manufacturing stage, according to some embodiments of the present disclosure.
Figure 3N:
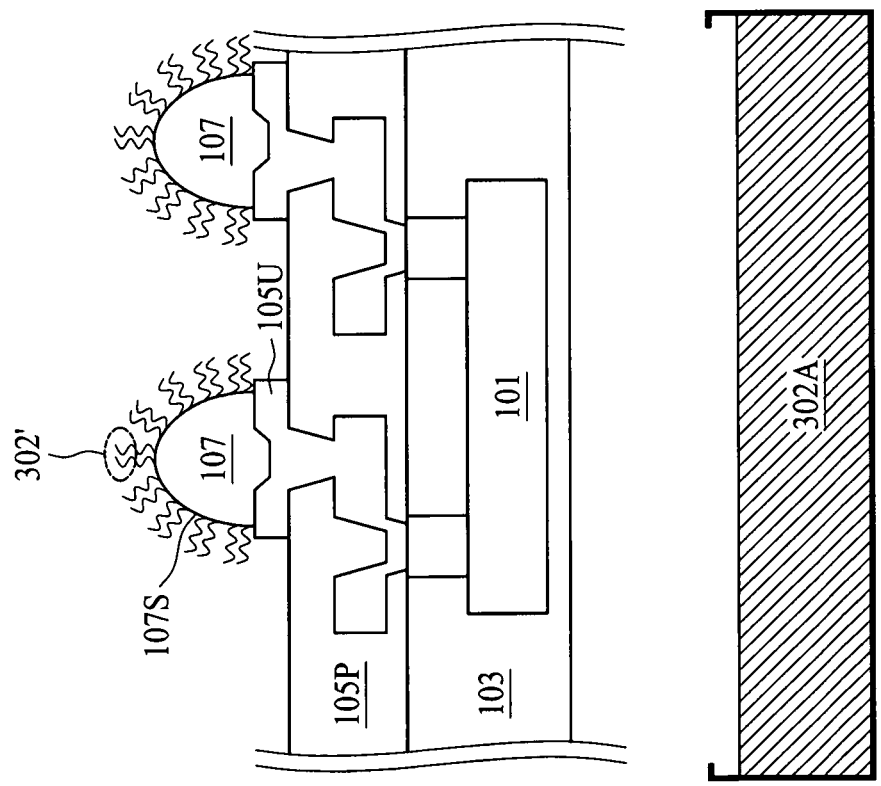
Figure 3P:
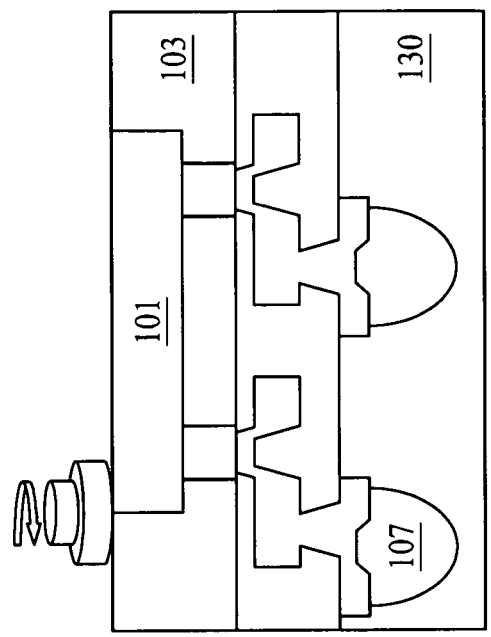
FIG. 3O, FIG. 3P, FIG. 3Q, FIG. 3R, FIG. 3S are cross-sectional views of a semiconductor package structure during an intermediate manufacturing stage, according to some embodiments of the present disclosure.
Figure 3O:
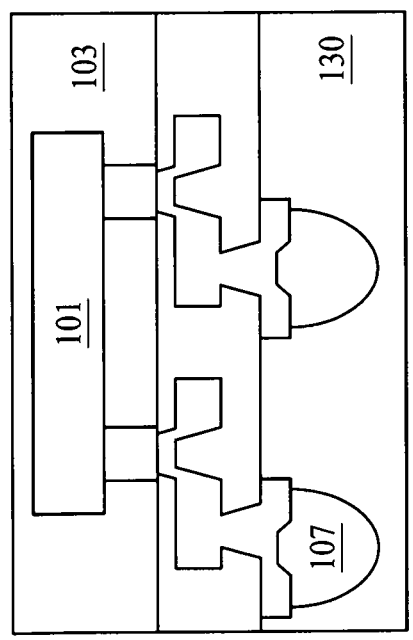
Figure 3S:
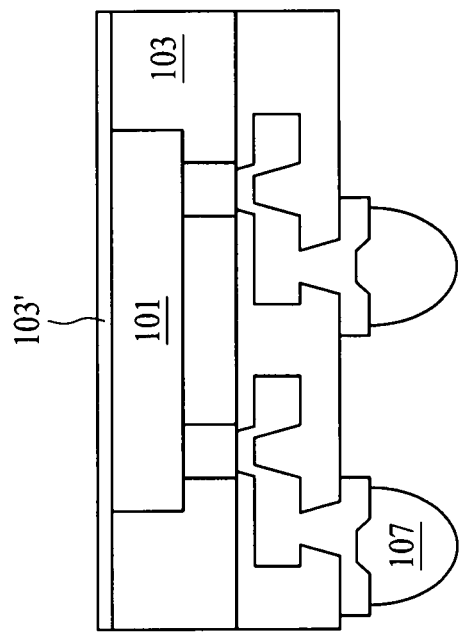
Figure 3Q:
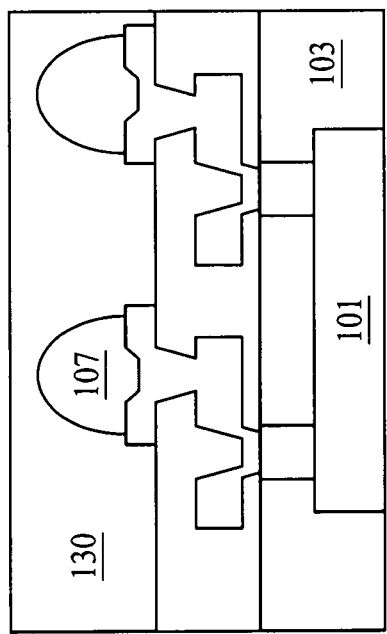
Figure 3R:
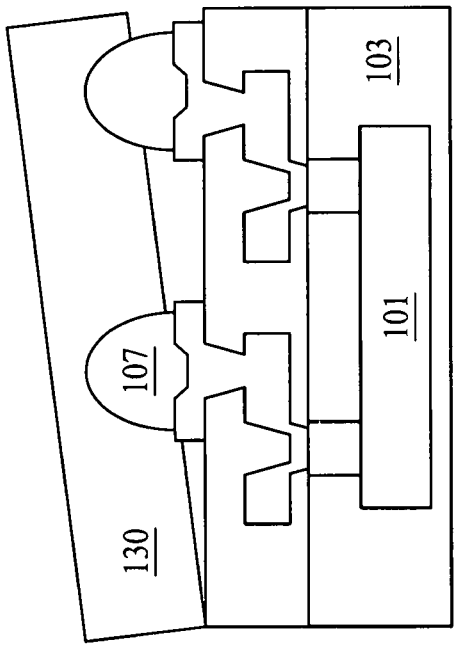
Figure 3T:
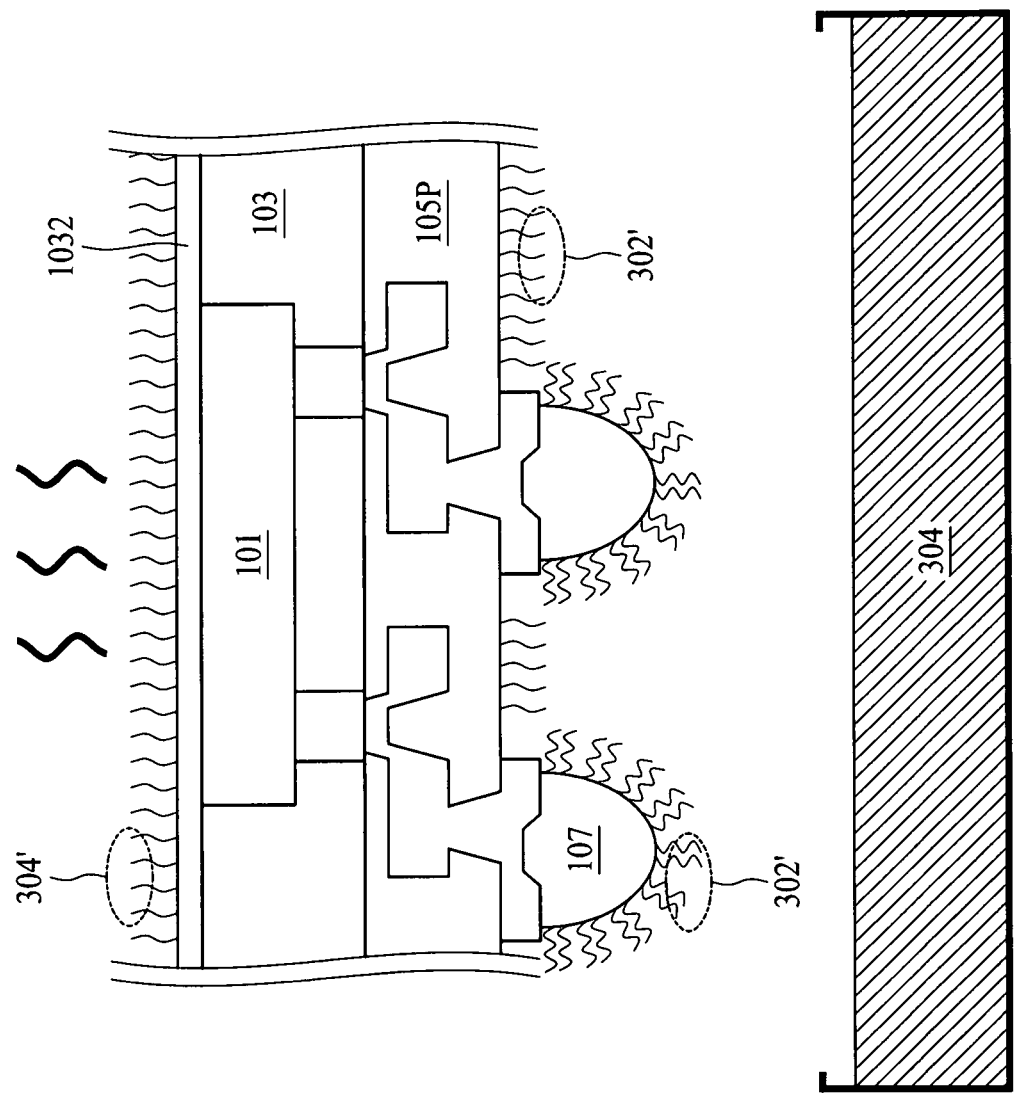
FIG. 3T, FIG. 3U, FIG. 3V, FIG. 3W are a cross-sectional views of a semiconductor package structure during an intermediate manufacturing stage, according to some embodiments of the present disclosure.
Figure 3U:
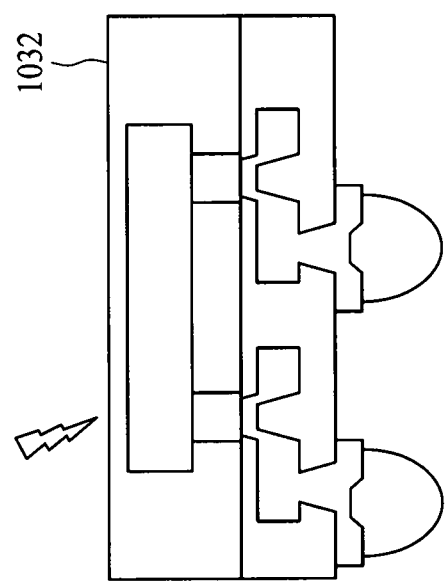
Figure 3V:
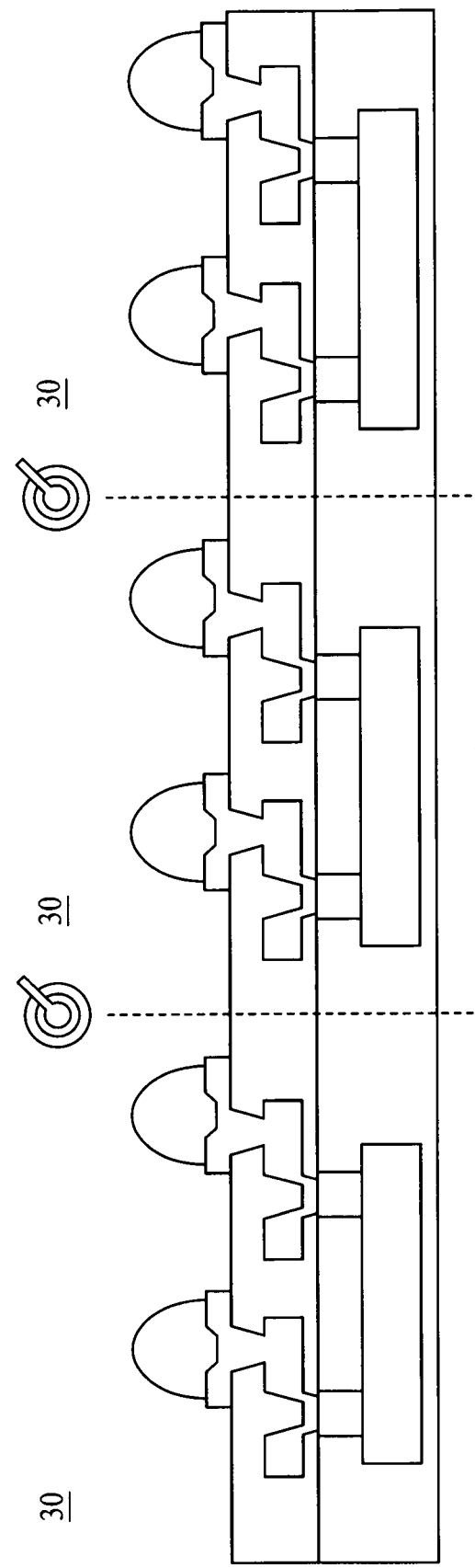
Figure 3W:
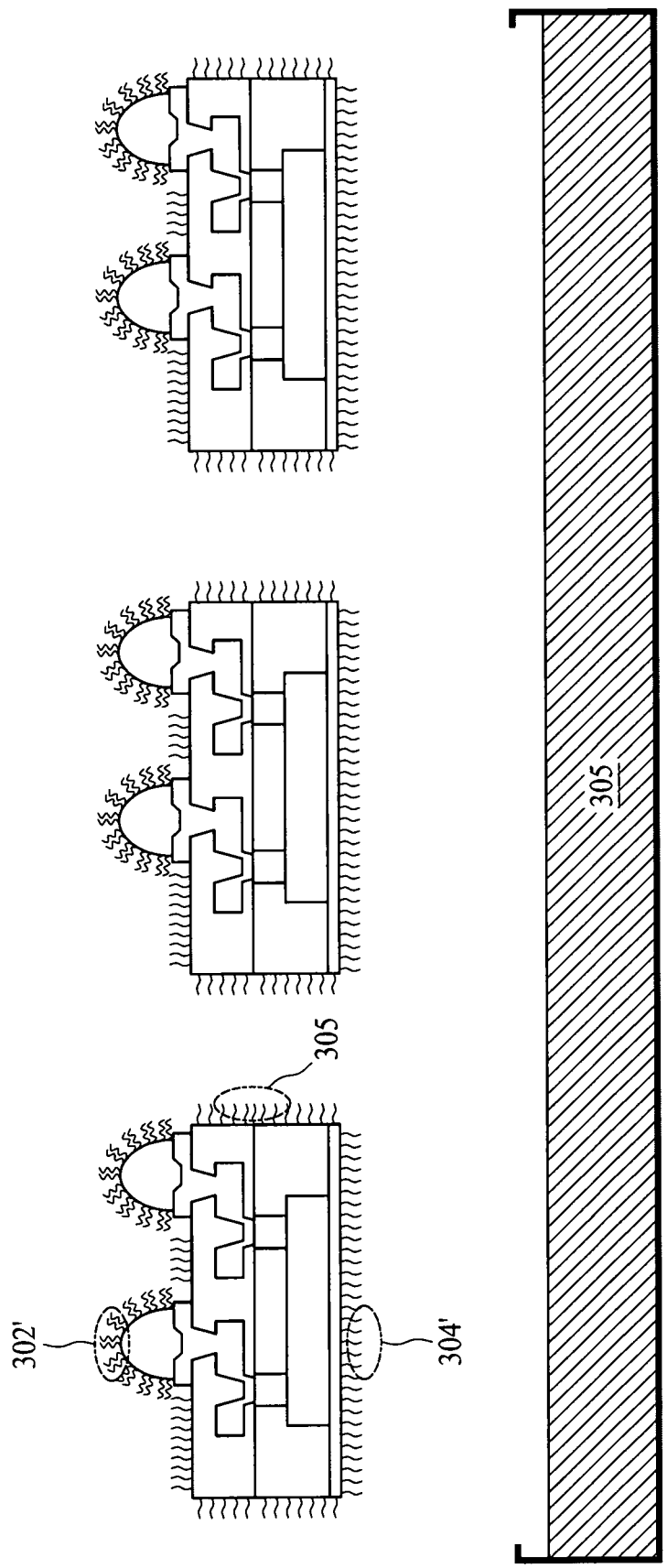

FIG. 3A to FIG. 3W illustrates a semiconductor package structure during an intermediate manufacturing stage in a sequential order. FIG. 3A is a cross-sectional view of a semiconductor package structure during an intermediate manufacturing stage, according to some embodiments of the present disclosure. Numeric labels in FIG. 3A to FIG. 3W which are identical to those in semiconductor package structure 10 of FIG. 1 or semiconductor structure 20 of FIG. 2, can be referred thereto and are not repeated here for brevity. One semiconductor chip 101 on a semiconductor panel, for example, a 600 mm*600 mm semiconductor panel, is illustrated in FIG. 3A for the purpose of description. In FIG. 3A, prior to placing the semiconductor chip 101 on any supporting carrier or encapsulating the semiconductor chip 101 with package body 103, the semiconductor chip 101 is coated with a self-assembled monolayer (SAM) 303' on the active surface 101A, the back surface 101B, and the side surfaces 101S of the semiconductor chip 101. In some embodiments, the coating of the SAM 303' may include immersing the semiconductor chip 101 into a SAM solution 303A having a first amphiphilic polymer. In some embodiments, the first amphiphilic polymer includes a head group and a terminal group. The head group may bond to the active surface 101A, the back surface 101B, and the side surfaces 101S of the semiconductor chip 101, and the terminal group is opposite to the head group. In some embodiments, the head group may include hydroxyl group. In some embodiments, the terminal group may include hydrocarbon-based alkyl or fluorocarbon-based alkyl. In some embodiments, the first amphiphilic polymer includes FOA.

FIG. 3A' is a cross-sectional view of a semiconductor package structure during an alternative intermediate manufacturing stage to FIG. 3A, according to some embodiments of the present disclosure. In one alternative, as shown in FIG. 3A', because the semiconductor chip 101 demonstrates a heterogeneous surface, that is, having a metallic surface at the conductive terminals 109 as well as a dielectric surface at the semiconductor chip body, coating of the SAM 303' may include immersing the semiconductor chip 101 into an SAM solution 303B concurrently having the first amphiphilic polymer and a second amphiphilic polymer. The first amphiphilic polymer is previously addressed in FIG. 3A. In some embodiments, the second amphiphilic polymer includes a head group and a terminal group. The head group may bond to a surface of the conductive terminals 109, and the terminal group is opposite to the head group. In some embodiments, the head group may include thiol group. In some embodiments, the terminal group may include hydrocarbon-based alkyl or fluorocarbon-based alkyl. In some embodiments, the second amphiphilic polymer includes FOT.

Although not illustrated in FIG. 3A or FIG. 3A', in another alternative, the coating of the SAM 303' may include immersing the semiconductor chip 101 into a first SAM solution having the first amphiphilic polymer, followed by immersing the semiconductor chip 101 into a second SAM solution having the second amphiphilic polymer.

FIG. 3B and FIG. 3C are cross-sectional views of a semiconductor package structure during an intermediate manufacturing stage, according to some embodiments of the present disclosure. In FIG. 3B, a carrier 102 is provided with an adhesive layer 102T disposed on a top surface thereof. In FIG. 3C, the semiconductor chip 101 of FIG. 3A or FIG. 3A' is attached to the carrier 102 by an external bonding force. Since the back surface 101B of the semiconductor chip 101 is coated with SAM 303', the bonding strength between the back surface 101B and the adhesive layer 102T is deteriorated, therefore, the external bonding force applied to the SAM-treated semiconductor chip 101 shall be greater than the external bonding force applied to non-SAM-treated semiconductor chip. For example, an external bonding force of from about 25 kilogram-force/centimeter square (kgf/cm$^2$) to about 35 kgf/cm$^2$ may be applied to a non-SAM-treated semiconductor chip in order to provide sufficient bonding strength without causing the adhesive layer 102T to deform. As illustrated as a comparative example in FIG. 3C', excessive bonding force may cause the adhesive layer 102T to deform at the interface contacting the bottom surface 101B of the semiconductor chip 101 and a side surface of the semiconductor chip 101 may be contaminated by the adhesive layer 102T. Such deformation of the adhesive layer 102T may increase the difficulties in the subsequent de-tape operation. Nevertheless, in current embodiment, the external bonding force from about 35 kgf/cm$^2$ to about 50 kgf/cm$^2$ is applied to an SAM-treated semiconductor chip 101 in order to provide sufficient bonding strength without causing the adhesive layer 102T to deform.

FIG. 3D, FIG. 3E, FIG. 3F, FIG. 3G, FIG. 3H are cross-sectional views of a semiconductor package structure during an intermediate manufacturing stage, according to some embodiments of the present disclosure. In FIG. 3D, a prebake operation is performed on the semiconductor chip 101 prior to the encapsulation operation in FIG. 3E. In FIG. 3E, a package body 103 is formed to cover the active surface 101A, including the conductive terminal 109, and the side surfaces 101S of the semiconductor chip 101. The package body 103 includes a first surface 1031 proximal to the active surface 101A of the semiconductor die 101 and a second surface 1032 proximal to the back surface 101B of the semiconductor die 101. In FIG. 3F, the carrier 102 is debonded from the package body 103, followed by a de-tape operation illustrated in FIG. 3G. Similarly, since the back surface 101B of the semiconductor chip 101 is coated with SAM 303', the de-tape operation is easier and yield is higher than when no SAM 303' is coated on the back surface 101B. In FIG. 3H, a backside lamination 103' is formed over the back surface 101B and the second surface 1032 of the package body 103. In some embodiments, the backside lamination 103' is composed of substantially identical or equivalent materials as the package body 103, for example, such as epoxy. Therefore, the surface of the as-formed backside lamination 103' shall be hydrophilic as the surface of package body 103 if no hydrophobic treatment is further performed.

FIG. 3FA is a cross-sectional view of a semiconductor package structure during an intermediate manufacturing stage, according to some comparative embodiments of the present disclosure. When no SAM 303' is coated at the back surface 101B of the semiconductor chip 101, the bonding strength between the semiconductor chip 101 and the adhesive layer 102T is sufficient to prevent package body 103 from entering the interface therebetween, that is, no mold bleed out may be observed. FIG. 3FB is a cross-sectional view of a semiconductor package structure during an intermediate manufacturing stage, according to some embodiments of the present disclosure. As previously discussed in FIG. 3C, coating of the SAM 303' at the back surface 101B of the semiconductor chip 101 reduces the bonding strength between the semiconductor chip 101 and the adhesive layer 102T. When performing an encapsulation operation, package body 103 may be easier to enter the interface between the semiconductor chip 101 and the adhesive layer 102T, causing the mold bleed out to occur. The de-tape operation illustrated in FIG. 3G may lead to a higher yield when the mold bleed out takes place.

FIG. 3I, FIG. 3J, FIG. 3K, FIG. 3L are cross-sectional views of a semiconductor package structure during an intermediate manufacturing stage, according to some embodiments of the present disclosure. In FIG. 3I, the package body 103 encapsulating the semiconductor chip 101 is coated with a SAM 301' on the first surface 1031 and the second surface 1032 of the package body 103. In some embodiments, when the surface of the backside lamination 103' is formed over the second surface 1032 of the package body 103 then the backside lamination is coated with the SAM 301'. In some embodiments, the coating of the SAM 301' may include immersing the semiconductor chip 101 and the package body 103 into a SAM solution 301 having a first amphiphilic polymer. In some embodiments, the first amphiphilic polymer includes a head group and a terminal group. The head group may bond to the first surface 1031 and the second surface 1032 of the package body 103, and the terminal group is opposite to the head group. In some embodiments, the head group may include hydroxyl group. In some embodiments, the terminal group may include hydrocarbon-based alkyl or fluorocarbon-based alkyl. In some embodiments, the first amphiphilic polymer includes FOA.

In FIG. 3J, the semiconductor package structure undergoes a laser marking operation on the second surface 1032 of the package body 103. FIG. 3J omits the backside lamination 103' illustrated in FIG. 3I because in some embodiments, the backside lamination 103' can be optional in manufacturing the semiconductor package structure. In FIG. 3K, the first surface 1031 of the package body 103 is grinded to expose a surface of the conductive terminal 109 from a surface of the package body 103. In FIG. 3L, a conductive wiring layer 105 is formed over the grinded surface at the first surface 1031 of the package body 103 in order to electrically couple the conductive wires in the conductive wiring layer 105 to the conductive terminal 109 on the semiconductor chip 101. In some embodiments, the conductive wiring layer 105 includes a passivation layer 105P surrounding the RDL 105R and the UBM 105U.

FIG. 3M is a cross-sectional view of a semiconductor package structure during an intermediate manufacturing stage, according to some embodiments of the present disclosure. FIG. 3M is an optional operation which a semiconductor panel is further sawed into suitable dimension for subsequent processing. For example, FIG. 3M' is a top view of a semiconductor panel having a side length L. The panel can be sawed along dotted lines so as to obtain four smaller panels with a side length of L/2. In some embodiments, the original panel has a dimension of 600 mm*600 mm, and the sawed panel has a dimension of 300 mm*300 mm dimension.

FIG. 3N is a cross-sectional view of a semiconductor package structure during an intermediate manufacturing stage, according to some embodiments of the present disclosure. In FIG. 3N, external connection terminals 107 are positioned over the UBM 105U of the conductive wiring layer 105 and the semiconductor package structure is coated with an SAM 302', specifically at the surface 107S of the external connection terminal 107. In some embodiments, the coating of the SAM 302' may include immersing the semiconductor package structure into a SAM solution 302A having a second amphiphilic polymer. In some embodiments, the second amphiphilic polymer includes a head group and a terminal group. The head group may bond to a metal surface, such as the surface 107S of the external connection terminal 107, as well as a portion of the UBM 105U exposed from the passivation layer 105P, and the terminal group is opposite to the head group. In some embodiments, the head group may include hydroxyl group. In some embodiments, the terminal group may include hydrocarbon-based alkyl or fluorocarbon-based alkyl. In some embodiments, the second amphiphilic polymer includes FOT.

FIG. 3N' is a cross-sectional view of a semiconductor package structure during an alternative intermediate manufacturing stage to FIG. 3N, according to some embodiments of the present disclosure. In one alternative, as shown in FIG. 3 N', because the semiconductor package structure demonstrates a heterogeneous surface, that is, having a metallic surface at the external connection terminal 107 as well as a dielectric surface at the package body 103 and the passivation layer 105P, coating of the SAM 302' may include immersing the semiconductor package structure into an SAM solution 302B having the first amphiphilic polymer and a second amphiphilic polymer, and in additional to the surface 107S of the external connection terminal, the SAM 302' is bonded to the surface 105S of the passivation layer 105P and a surface 103S of the package body 103. In some embodiments, the surface 103S can be the second surface 1032 of the package body 103. The second amphiphilic polymer is previously addressed in FIG. 3N. In some embodiments, the first amphiphilic polymer includes a head group and a terminal group. The head group may bond to the second surface 103S of the package body 103 and the surface 105S of the passivation layer 105P, and the terminal group is opposite to the head group. In some embodiments, the head group may include thiol group. In some embodiments, the terminal group may include hydrocarbon-based alkyl or fluorocarbon-based alkyl. In some embodiments, the first amphiphilic polymer includes FOA.

Although not illustrated in FIG. 3N or FIG. 3N', in another alternative, the coating of the SAM 302' may include immersing the semiconductor package structure into a first SAM solution having the second amphiphilic polymer, followed by immersing the semiconductor package structure into a second SAM solution having the first amphiphilic polymer.

FIG. 3O, FIG. 3P, FIG. 3Q, FIG. 3R, FIG. 3S are cross-sectional views of a semiconductor package structure during an intermediate manufacturing stage, according to some embodiments of the present disclosure. In FIG. 3O and FIG. 3P, the semiconductor package structure is flipped over and a lamination operation is performed to attach the external connection terminals 107 to a tape 130. The laminated semiconductor package structure is then grinded on the second surface 103S of the package body 103 to reduce the thickness of the semiconductor package structure. In some embodiments, the grinding operation illustrate in FIG. 3P is performed until a back surface 101B of the semiconductor chip 101 is exposed from the package body 103. An ultraviolet (UV) illumination operation is performed on the tape 130, as shown in FIG. 3Q, to facilitate the de-tape operation in FIG. 3R. Optionally, a backside lamination 103' can be formed over the second surface 1032 of the package body 103, as shown in FIG. 3S.

FIG. 3T, FIG. 3U, FIG. 3V, FIG. 3W are a cross-sectional view of a semiconductor package structure during an intermediate manufacturing stage, according to some embodiments of the present disclosure. In FIG. 3T, the semiconductor package structure is coated with an SAM 304' at the second surface 1032 of the package body 103 or at the lamination 103' formed in FIG. 3S. Since the SAM 302' previously described in FIG. 3N and FIG. 3N' preoccupied the surface 107S of the external connection terminal 107 and the surface 105S of the passivation layer 105P, the SAM 304' may selectively occupy the second surface 1032 of the package body 103 or at the lamination 103'. In some embodiments, the coating of the SAM 304' may include immersing the semiconductor chip 101 into a SAM solution 303A having a first amphiphilic polymer. In some embodiments, the first amphiphilic polymer includes a head group and a terminal group. The head group may bond to the second surface 1032 of the package body 103, and the terminal group is opposite to the head group. In some embodiments, the head group may include hydroxyl group. In some embodiments, the terminal group may include hydrocarbon-based alkyl or fluorocarbon-based alkyl. In some embodiments, the first amphiphilic polymer includes FOA. In FIG. 3U, an optional laser marking operation is performed on the second surface 1032 of the package body 103. In FIG. 3V, a die saw operation is performed to separate the sawed panel into a plurality of individual semiconductor packages 30.

In some embodiments, each of the semiconductor packages 30 is then coated with an SAM 305' at the sidewall of the passivation layer 105P and the package body 103, as shown in FIG. 3W. Because the second surface 1032 of the package body 103, the surface 107S of the external connection terminals 107, and the surface 105S of the passivation layer 105P are pre-occupied by SAMs 302' and 304' as previously described in FIG. 3T, the SAM 305' may be selectively bonded to the sidewall of the passivation layer 105P and the package body 103. In some embodiments, the coating of the SAM 305' may include immersing the semiconductor packages 30 into a SAM solution 305 having a first amphiphilic polymer. In some embodiments, the first amphiphilic polymer includes a head group and a terminal group. The head group may bond to the passivation layer 105P and the package body 103, and the terminal group is opposite to the head group. In some embodiments, the head group may include hydroxyl group. In some embodiments, the terminal group may include hydrocarbon-based alkyl or fluorocarbon-based alkyl. In some embodiments, the first amphiphilic polymer includes FOA.

Figure 4A:
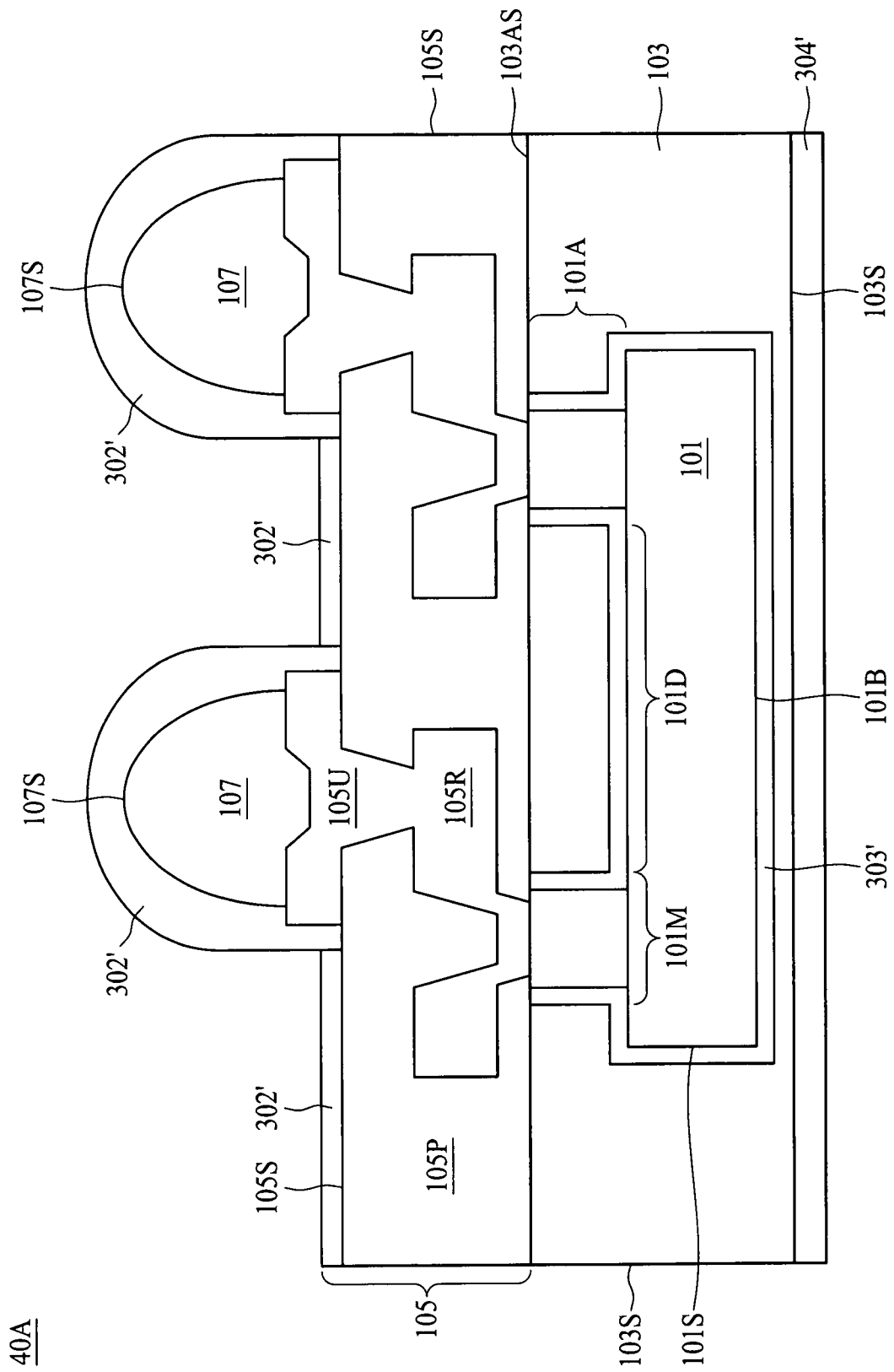
FIG. 4A is a cross-sectional view of a semiconductor package structure, according to some embodiments of the present disclosure.

Referring to FIG. 4A, FIG. 4A is a cross-sectional view of a semiconductor package structure 40A, according to some embodiments of the present disclosure. Numeric labels in semiconductor package structure 40A which are identical to those in semiconductor package structure 20 of FIG. 2 can be referred thereto and are not repeated here for brevity. When the coating operation illustrated in FIG. 3W is not performed after the die-sawing operation, side surface 103S of the package body 103 and side surface 105S of the passivation layer 105P are not coated with the hydrophobic layer. Moreover, the coating operations illustrated in FIG. 3A and FIG. 3A' render a hydrophobic layer 303' coated on the active surface 101A and the back surface 101B of the semiconductor die 101. The active surface 101A further includes a dielectric surface 101D and a metallic surface 101M. In some embodiments, the dielectric surface 101D may be coated with FOA and the metallic surface 101M may be coated with FOT. In some embodiments the side surface 101S and the back surface 101B of the semiconductor die 101 may include a semiconductor surface coated with FOA. The coating operations illustrated in FIG. 3N and FIG. 3N' render a hydrophobic layer 302' coated on the surface 105S of the passivation layer 105P and the surface 107S of the external connection terminals 107. In some embodiments, the hydrophobic layer 302' coated on the surface 105S may include FOA, and the hydrophobic layer 302' coated on the surface 107S may include FOT. The coating operations illustrated in FIG. 3T render a hydrophobic layer 304' coated on the surface 103S of the package body 103. In some embodiments, the hydrophobic layer 304' may include FOA.

Figure 4B:
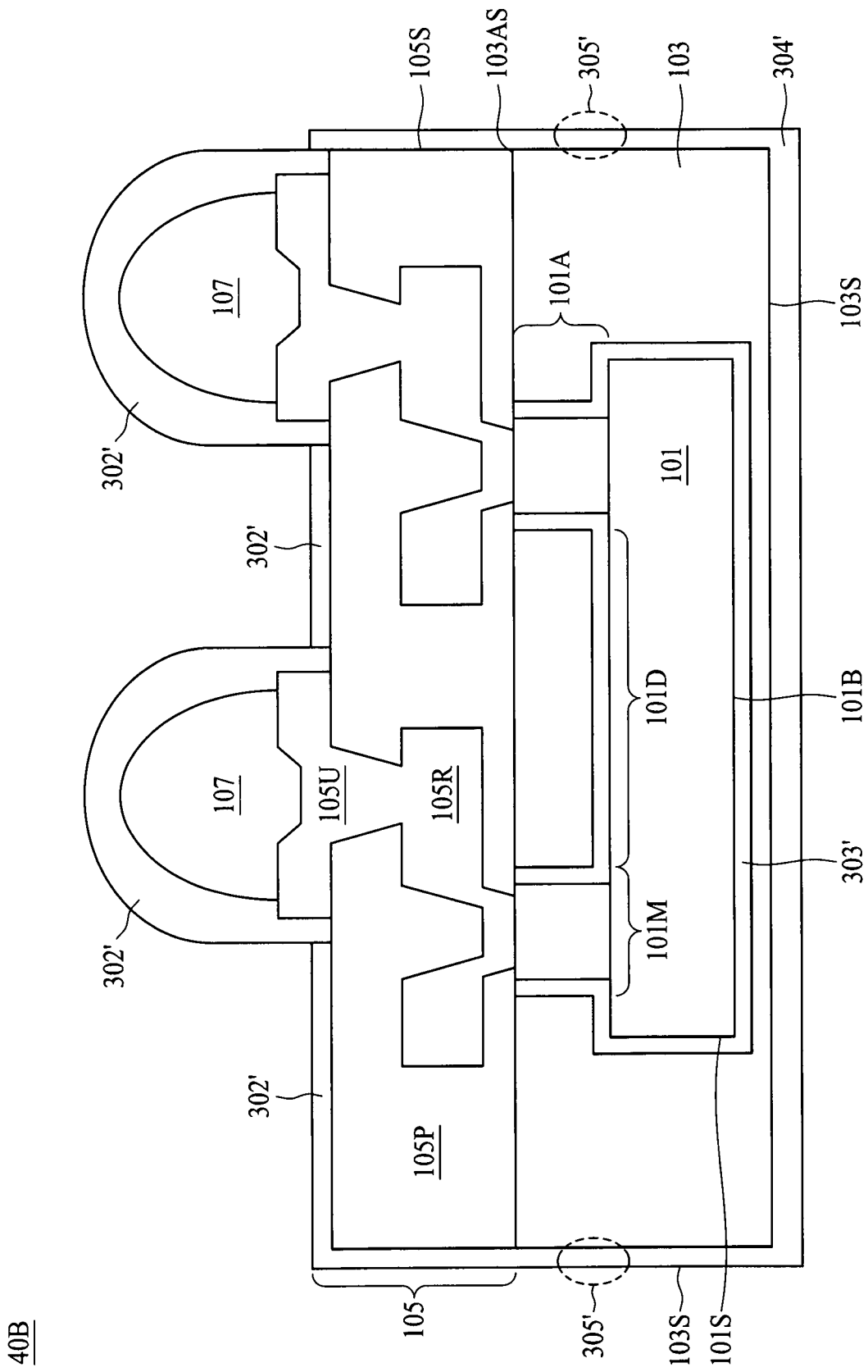
FIG. 4B is a cross-sectional view of a semiconductor package structure, according to some embodiments of the present disclosure.

Referring to FIG. 4B, FIG. 4B is a cross-sectional view of a semiconductor package structure 40B, according to some embodiments of the present disclosure. Numeric labels in semiconductor package structure 40B which are identical to those in semiconductor package structure 40A of FIG. 4A can be referred thereto and are not repeated here for brevity. When the coating operation illustrated in FIG. 3W is performed after the die-sawing operation, side surface 103S of the package body 103 and side surface 105S of the passivation layer 105P are coated with the hydrophobic layer 305'. In some embodiments, the hydrophobic layer 305' may include FOA.

Figure 5:
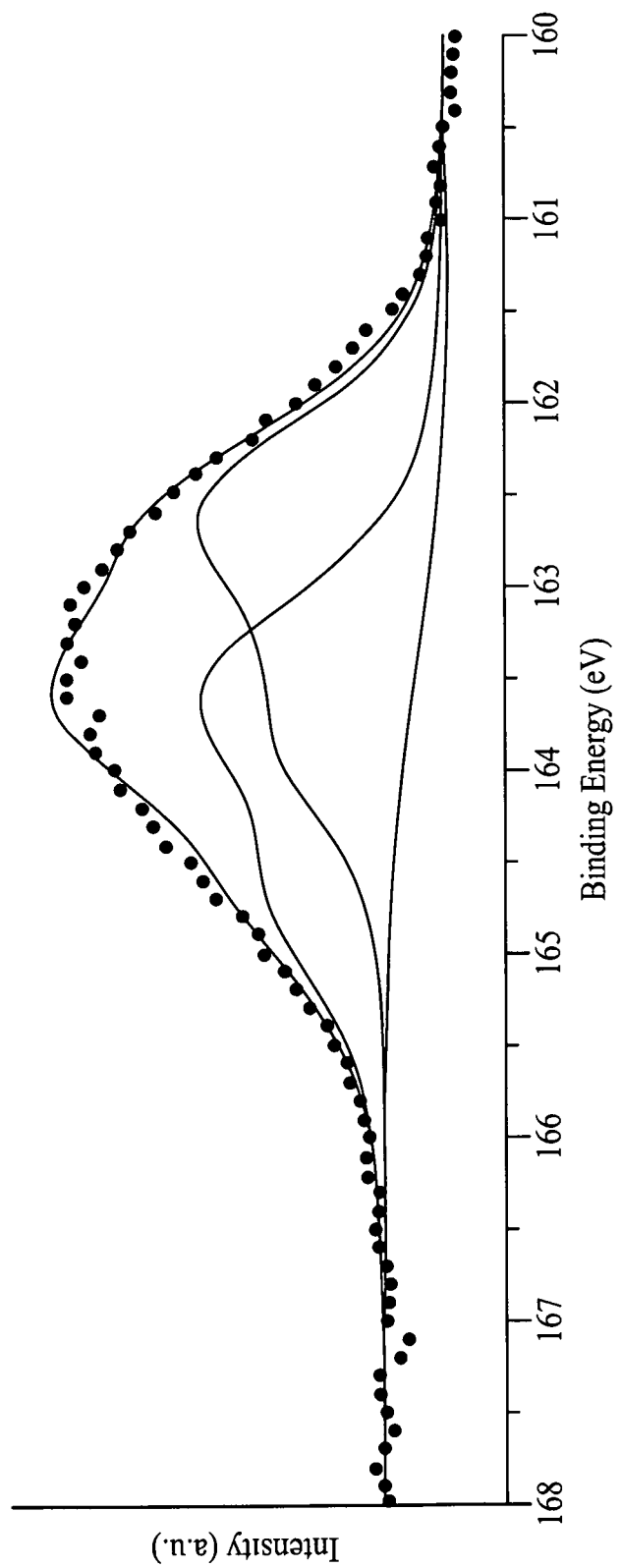
FIG. 5 is an X-ray photoelectron spectroscopy (XPS) diagram as an example of a surface analysis at a metal surface of the semiconductor package structure, according to some embodiments of the present disclosure.

FIG. 5 is an X-ray photoelectron spectroscopy (XPS) diagram exemplifying a surface analysis at a metal surface of the semiconductor package structure, according to some embodiments of the present disclosure. For example, when conducting a surface analysis using XPS on the surface 107S of the external connection terminal 107, the XPS result shows a Sulfur 2P (S2P) orbital characteristic as shown in FIG. 5. The S2P signal peaks within a range of from about 162 eV and 165 eV, showing an existence of a covalent bond connecting carbon and sulfur in the SAM solution containing FOT. The XPS testing condition for FIG. 5 is described below.

The spectrum is recorded at a 45 degrees take-off angle, relative to the substrate with a spectrometer using monochromatized Al Kα radiation (1486.6 eV). The binding energies of the core levels were calibrated against the C1s binding energy set at 285.0 eV, an energy characteristic of alkyl moieties. The peaks were analyzed using mixed Gaussian-Lorentzian curves (80% of Gaussian character).

Figure 6:
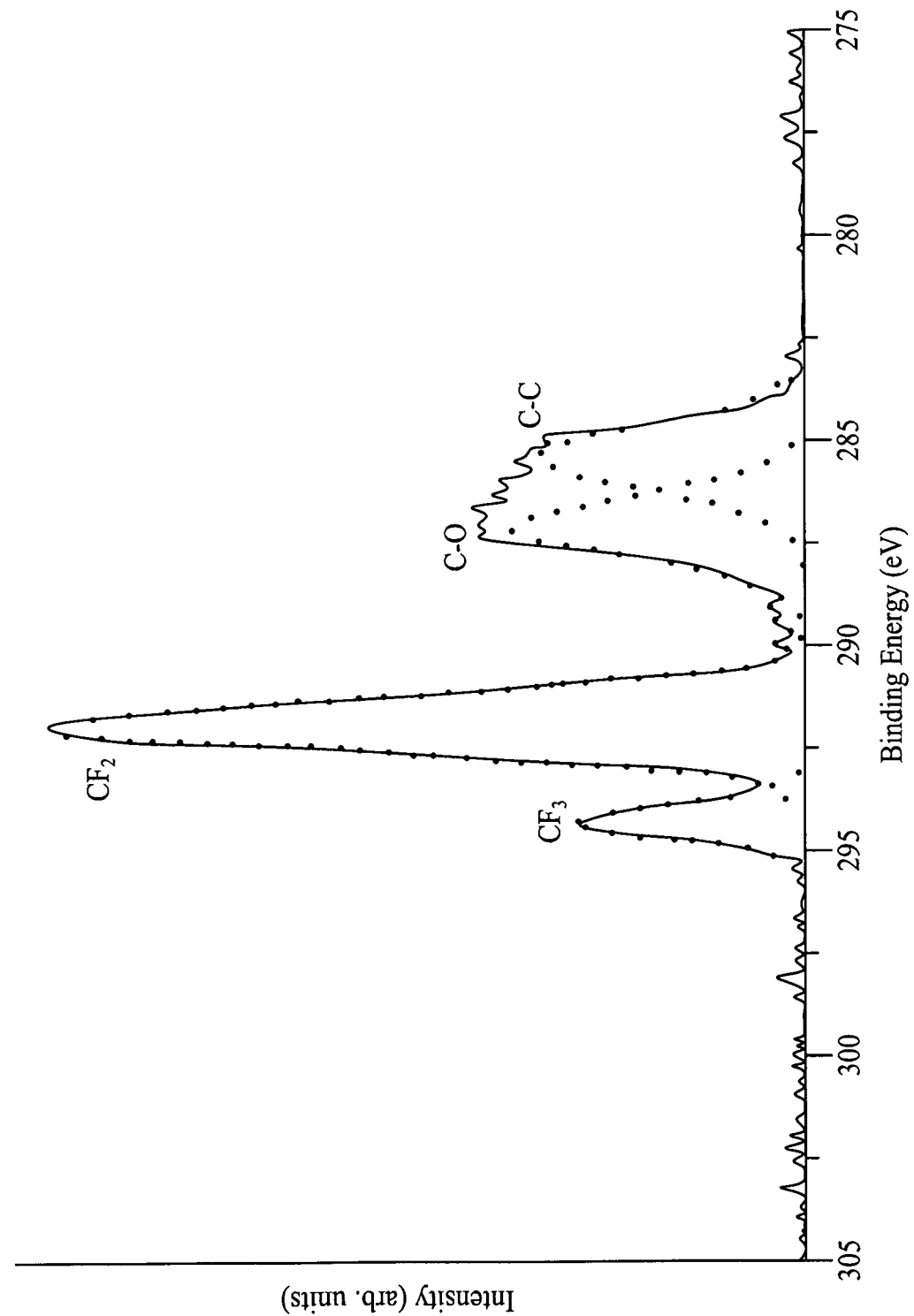
FIG. 6 is an XPS diagram exemplifying a surface analysis at a dielectric surface of the semiconductor package structure, according to some embodiments of the present disclosure.

FIG. 6 is an XPS diagram exemplifying a surface analysis at a dielectric surface of the semiconductor package structure, according to some embodiments of the present disclosure. For example, when conducting a surface analysis using XPS on the surface 105S of the passivation layer 105P and the surface 103S of the package body 103, the XPS result shows a carbon 1s (C1S) orbital characteristic as shown in FIG. 6. The C1S signal peaks within a range of from about 280 eV and 300 eV, showing an existence of covalent bonds connecting carbon and fluorine, carbon and oxygen, carbon and carbon, in the SAM solution containing FOA. The XPS testing condition for FIG. 6 is described below.

This calibration can be conducted using a Kratos Analytical Axis ULTRA DLD system with a monochromatic aluminum source (Al Kα radiation of 1486.7 eV) operating at 150 W with a 90 degrees take-off angle. Survey scans (0-1200 eV) can be acquired using a pass energy of 160 eV, a dwell time of 100 ms, and 1 sweep. High-resolution scans can be obtained using a pass energy of 20 eV, a dwell time of 500 ms, and integrating the results of 10 scans.

Figure 7:
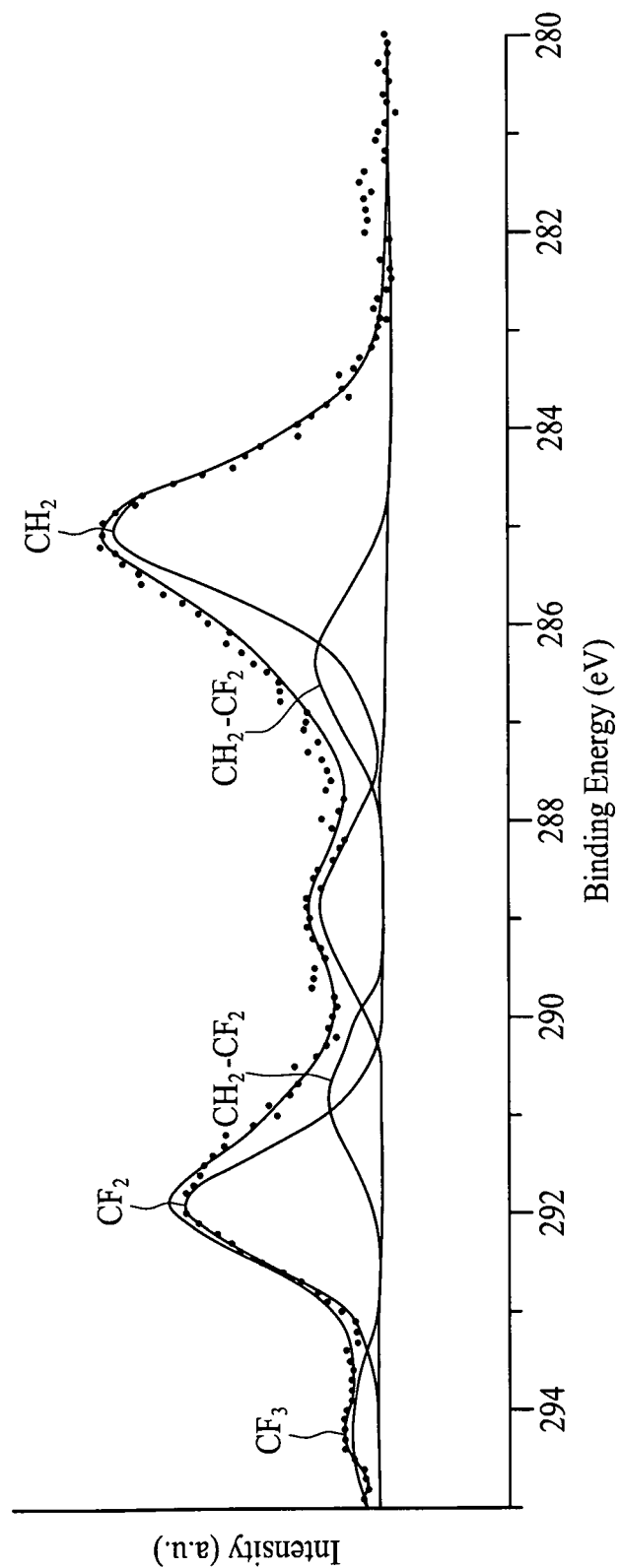
FIG. 7 is an XPS diagram exemplifying a surface analysis at a metal surface of the semiconductor package structure, according to some embodiments of the present disclosure.

FIG. 7 is an XPS diagram exemplifying a surface analysis at a metal surface of the semiconductor package structure, according to some embodiments of the present disclosure. For example, when conducting a surface analysis using XPS on the surface 107S of the external connection terminal 107, the XPS result shows a Carbon 1S (C1S) orbital characteristic as shown in FIG. 7. The C1S signal peaks within a range of from about 280 eV and 295 eV, showing an existence of covalent bonds connecting carbon and fluorine, carbon and hydrogen, carbon and carbon, in the SAM solution containing FOT. The XPS testing condition for FIG. 7 can be referred to that previously described in FIG. 5.

FIG. 8 is a table showing operational stages of the semiconductor package structure, according to some embodiments of the present disclosure. Each of the SAM coating operations previously described in FIG. 3A, FIG. 3A', FIG. 3I, FIG. 3N, FIG. 3N', FIG. 3T, and FIG. 3W may apply the operational stages listed on FIG. 8. Before immersing the semiconductor chip or semiconductor package structure into the desired SAM solution tank, a pre-clean operation including, for example, an iso-propylalcohol (IPA) rinse followed by an iso-octane immersion, can be performed. After the desired SAM solution immersion, a post-clean operation including, for example, an iso-octane immersion followed by an IPA rinse, can be performed. As listed in FIG. 8, the reaction time of SAM solution immersion is around 10 minutes. Compared to physical vapor deposition (PVD) of a hydrophobic layer, such as a $Cr_2N$ layer or a $(CrAl)_2N$ layer, and chemical vapor deposition (CVD) of a hydrophobic layer, such as an amorphous carbon layer, the reaction time of SAM solution immersion can be greatly reduced, increasing the production throughput of the semiconductor package structure.

FIG. 9 is a table showing operational stages of the semiconductor package structure, according to some comparative embodiments of the present disclosure. As previously described when addressing FIG. 8, the PVD of a $Cr_2N$ layer takes about 25 minutes, and a $(CrAl)_2N$ layer takes about 60 minutes. The CVD of an amorphous carbon layer takes about 880 minutes. Both PVD and CVD coating of a hydrophobic film take more processing time compared to the SAM coating presented in present disclosure.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A method for manufacturing a semiconductor package structure, comprising:
   providing a semiconductor chip;
   encapsulating the semiconductor chip via a package body, the package body having a first surface opposite to a second surface; and
   coating a first self-assembled monolayer (SAM) over the first surface and the second surface of the package body.

2. The method of claim 1, wherein coating the first SAM comprises immersing the first surface and the second surface into a first SAM solution having a first amphiphilic polymer, the first amphiphilic polymer having a first head group bonding to the first surface and the second surface.

3. The method of claim 2, wherein the first amphiphilic polymer of the first SAM solution further comprises a first terminal group having one of hydrocarbon-based alkyl and fluorocarbon-based alkyl.

4. The method of claim 2, wherein the first head group comprises a hydroxyl group.

5. The method of claim 2, further comprising:
   forming a conductive wiring layer at the first surface of the package body;
   placing an external connection terminal on the conductive wiring layer; and
   coating a second SAM on the external connection terminal.

6. The method of claim 5, wherein coating the second SAM comprises immersing the external connection terminal into a second SAM solution, and wherein the second SAM solution comprises the first amphiphilic polymer.

7. The method of claim 5, wherein coating the second SAM comprises immersing the external connection terminal into a second SAM solution having a second amphiphilic polymer, the second amphiphilic polymer having a second head group comprising a thiol group.

8. The method of claim 7, wherein the second amphiphilic polymer of the second SAM solution further comprises a second terminal group having one of hydrocarbon-based alkyl and fluorocarbon-based alkyl.

9. The method of claim 1, further comprising coating a third SAM over the semiconductor chip prior to encapsulating the semiconductor chip via the package body.

10. The method of claim 9, further comprising:
    grinding the second surface of the package body; and
    coating a fourth SAM over the second surface after grinding.

11. The method of claim 9, wherein coating the third SAM comprises immersing the semiconductor chip into a third SAM solution having a first amphiphilic polymer and a second amphiphilic polymer.

12. A method for manufacturing a semiconductor package structure, comprising:
    providing a semiconductor chip having a first surface;
    transforming the first surface from a hydrophilic state to a hydrophobic state by immersing the semiconductor chip into a self-assembled monolayer (SAM) solution; and
    dicing the semiconductor chip into a plurality of semiconductor packages.

13. The method of claim 12, wherein the first surface comprising a heterogeneous surface.

14. The method of claim 13, wherein providing the semiconductor chip having a heterogeneous surface comprises:
    providing a semiconductor die having an active surface;
    encapsulating the semiconductor die via a package body, the package body comprising an epoxy surface;
    forming a conductive wiring layer over the package body and electrically coupled to the active surface; and
    placing an external connection terminal on the conductive wiring layer, the external connection terminal comprising a metallic surface.

15. The method of claim 13, wherein immersing the semiconductor chip into the SAM solution comprises:
    immersing the semiconductor chip into a first SAM solution before forming the conductive wiring layer, wherein the first SAM solution comprises a first amphiphilic polymer having a hydrophilic end comprising a hydroxyl group.

16. The method of claim 15, wherein the first amphiphilic polymer further comprises a hydrophobic end comprising one of hydrocarbon-based alkyl and fluorocarbon-based alkyl.

17. The method of claim 12, further comprising:
    forming an adhesive layer over a carrier;
    disposing the semiconductor chip over the carrier;
    applying a force on the semiconductor chip so as to bond the semiconductor chip and the carrier through the adhesive layer, wherein the force is within a range of from about 35 kgf/cm$^2$ to about 50 kgf/cm$^2$.

18. The method of claim 13, wherein providing the semiconductor chip having a heterogeneous surface comprises:
    providing a semiconductor die, the semiconductor die having a semiconductor surface; and
    forming conductive terminals on an active surface of the semiconductor die, the conductive terminal having a metallic surface.

19. The method of claim 18, wherein immersing the semiconductor chip into the SAM solution comprises:
    immersing the semiconductor chip into a third SAM solution after forming the conductive terminal on the active surface, wherein the third SAM solution comprises:
    a first amphiphilic polymer having a hydrophilic end comprising a hydroxyl group; and
    a second amphiphilic polymer having a hydrophilic end comprising a thiol group.

20. The method of claim 15, wherein immersing the semiconductor chip into the SAM solution comprises:
    immersing the semiconductor chip into a second SAM solution after placing an external connection terminal on the conductive wiring layer, wherein the second SAM solution comprises the first amphiphilic polymer and a second amphiphilic polymer having a hydrophilic end comprising a thiol group.

* * * * *